US006214673B1

(12) United States Patent
Grebs et al.

(10) Patent No.: US 6,214,673 B1
(45) Date of Patent: Apr. 10, 2001

(54) PROCESS FOR FORMING VERTICAL SEMICONDUCTOR DEVICE HAVING INCREASED SOURCE CONTACT AREA

(75) Inventors: Thomas Eugene Grebs, Mountaintop; Jason Richard Trost, Drums, both of PA (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/350,575

(22) Filed: Jul. 9, 1999

(51) Int. Cl.[7] ................................................. H01L 21/336
(52) U.S. Cl. ......................... 438/274; 438/138; 438/274; 438/302; 438/303; 438/304; 438/305; 257/344
(58) Field of Search ..................................... 438/156, 133, 438/135, 137, 138, 274, 302, 303, 304, 305, 306, 268, 344, 346, 408, 591, 595, 532, 649; 257/204, 344, 346, 408

(56) References Cited

U.S. PATENT DOCUMENTS

| 4,960,723 | * | 10/1990 | Davies ................................... 438/274 |
| 5,130,272 | * | 7/1992 | Ferla et al. ............................ 438/527 |
| 5,155,052 | * | 10/1992 | Davies ................................... 438/268 |
| 5,208,472 | | 5/1993 | Su et al. . |
| 5,498,555 | | 3/1996 | Lin . |
| 5,663,079 | | 9/1997 | Blanchard . |
| 5,668,065 | | 9/1997 | Lin . |
| 5,702,972 | * | 12/1997 | Tsai et al. ............................. 438/305 |

* cited by examiner

Primary Examiner—Charles Bowers
Assistant Examiner—Asok K. Sarkar
(74) Attorney, Agent, or Firm—Jaeckle Fleischmann & Mugel

(57) ABSTRACT

A process for forming a vertical semiconductor device having increased source contact area comprises forming a gate and a well region in a silicon substrate. Using dopant of a second conductivity type, a shallow source region is formed in the well region, and a first oxide layer is deposited over the gate and the source and well regions. The first oxide layer of oxide is etched to form a first oxide on the substrate adjacent the gate, a thin nitride layer is deposited over the gate and source regions, and a second oxide layer is deposited over the nitride layer and etched to form a second oxide spacer separated from the first oxide spacer and substrate by the nitride layer. These spacers are used as a mask to selectively remove the thin nitride layer from the gate and substrate and portions of the gate polysilicon and source region and thereby form in the source region a recessed portion comprising vertical and horizontal surfaces. Using a dopant of a first conductivity type, a shallow emitter region is formed in the well region underlying the recessed portion of the source region. The second oxide spacer and thin nitride layer separating it from the first oxide spacer are removed by etching, and a layer of conductive material is deposited on the remaining polysilicon layer and the source region.

12 Claims, 12 Drawing Sheets

PROCESS FOR FORMING VERTICAL SEMICONDUCTOR DEVICE HAVING INCREASED SOURCE CONTACT AREA

FIELD OF THE INVENTION

The present invention is related to semiconductor device and, more particularly, to a process for forming a vertical DMOS device having increased source contact area.

BACKGROUND OF THE INVENTION

Davies, U.S. Pat. No. 4,960,723, describes a method for making a self-aligned vertical field effect transistor wherein a silicon nitride sidewall spacer is formed around a polysilicon gate and an oxide spacer is formed covering the nitride sidewall spacer. Using the oxide spacer as a mask, a portion of the source is etched to expose a portion of the silicon substrate, following which the oxide spacer is removed. The contact area between the source and source electrode is thereby increased.

Lin, U.S. Pat. No. 5,498,555, discloses a method for making a horizontal FET having first spacer elements of polysilicon on the vertical sidewalls of the gate electrode and second spacer elements of silicon dioxide on the first spacer elements, the intent being to improve performance and provide immunity against hot carrier effects.

Su et al., U.S. Pat. No. 5,208,472, discloses a horizontal MOS device having two layers of dielectric film on the edge of the gate; the device is intended to have low junction leakage and reduced shorting from gate to source/drain.

Blanchard, U.S. Pat. No. 5,663,079, describes a method of making MOS-gated, double diffused semiconductor devices. In one embodiment, a nitride spacer layer is used to separate an implanted and diffused deep body region from the gate region, then removed by etching.

Lin, U.S. Pat. No. 5,668,065, discloses a process for simultaneously forming silicide-based self-aligned contacts and local interconnects in a horizontal semiconductor device. Oxide spacers adjacent the gate provide a lightly doped drain region within the drain region adjacent the gate and also isolate the gate from a subsequently formed self-aligned source region contact.

Tsai et al., U.S. Pat. No. 5,702,972, describes a method of reducing source/drain resistance in the fabrication of a horizontal semiconductor device, wherein first spacers of oxide are formed on the sidewalls of the gate electrode, and second spacers of nitride are formed on the first spacers. Following implanting of heavily doped source/drain regions, the second spacers are removed.

The disclosures of the just discussed six patents are incorporated herein by reference.

SUMMARY OF THE INVENTION

In accordance with the present invention, a process for forming a vertical semiconductor device having increased source contact area comprises: forming on a silicon substrate a gate that comprises a layer of polysilicon deposited on a layer of oxide, and implanting and driving a dopant of a first conductivity type into the substrate to form a well region in the substrate. A dopant of a second conductivity type is implanted and driven into the well region, thereby forming a shallow source region in the well region, and a first layer of oxide is deposited over the gate and over the source and well regions in the substrate. The first oxide layer is etched to form a first spacer of oxide on the substrate adjacent the gate.

A thin layer of nitride is deposited over the gate and over the source region in the substrate, and a second layer of oxide is deposited over the thin nitride layer. The second layer of oxide is etched to form a second spacer of oxide that is separated from the first oxide spacer and the substrate by the thin nitride layer. Using the oxide and nitride spacers as a mask, the polysilicon layer in the gate and the source region in the substrate are selectively etched to remove the thin nitride layer from the gate and substrate, a portion of the gate polysilicon layer, and a portion of the source region, thereby forming in the source region a recessed portion that comprises substantially vertical and horizontal surfaces.

A dopant of a first conductivity type is implanted and driven into the recessed portion of the source region, thereby forming a shallow emitter region in the well region underlying the recessed portion of the source region. The second oxide spacer and the thin nitride layer separating it from the first oxide spacer are removed by etching, and a layer of conductive material is deposited on the remaining polysilicon layer and on the source region, whose recessed portion provides increased contact area with the conductive material.

Further in accordance with the present invention, a process for forming a vertical semiconductor device having increased source contact area comprises: forming on a silicon substrate a gate that comprises a layer of polysilicon deposited on a layer of oxide, and implanting and driving a dopant of a first conductivity type into the substrate to form a well region in the substrate. A dopant of a second conductivity type is implanted and driven into the well region, thereby forming a shallow source region in the well region, and a layer of oxide is deposited over the gate and over the source and well regions in the substrate. The oxide layer is etched to form a first spacer of oxide on the substrate adjacent the gate.

A layer of nitride is deposited over the gate and over the source region in the substrate and etched to form a spacer of nitride adjacent the oxide spacer. Using the oxide and nitride spacers as a mask, the polysilicon layer in the gate and the source region in the substrate are selectively etched to remove a portion of the gate polysilicon layer and a portion of the source region, thereby forming in the source region a recessed portion that comprises substantially vertical and horizontal surfaces.

A dopant of a first conductivity type is implanted and driven into the recessed portion of the source region, thereby forming a shallow emitter region in the well region underlying the recessed portion of the source region. The nitride spacer is removed by etching, and a layer of conductive material is deposited on the remaining polysilicon layer and on the source region, whose recessed portion provides increased contact area with the conductive material.

The highly doped source region in the vertical semiconductor device made by the process of the present invention is characterized by increased source contact area that includes vertical and horizontal components and enables improved I-off capability.

BRIEF DESCRIPTION OF THE DRAWINGS

FIGS. 1–24 schematically illustrate the steps in a second embodiment of the process of the present invention.

DETAILED DESCRIPTION OF THE INVENTION

Enhancement of the source contact area to lower drain/source resistance in a vertical semiconductor device can be achieved by forming horizontal and vertical contact surfaces in the source region through the use of multiple spacers in accordance with the process of the present invention. One embodiment of the process is illustrated in FIGS. 1–12. Although the device depicted is an MOS-controlled thyristor, the process is useful for the fabrication of other devices such as, for example, MOSFETs and insulated gate bipolar transistors (IGBTs).

Reference is made below to dopants of first and second conductivity types. If the dopant of the first conductivity type is P, the dopant of the second conductivity type is N, and vice-versa.

Figure 1:
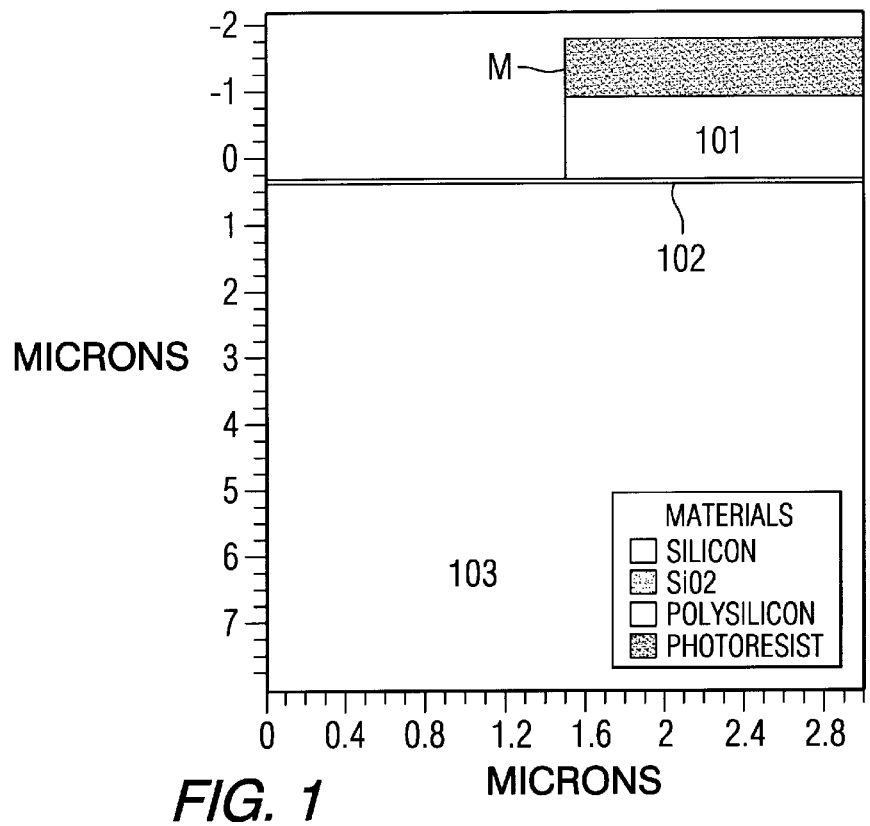
FIGS. 1–12 schematically depict the steps in one embodiment of the process of the present invention.
Figure 2:
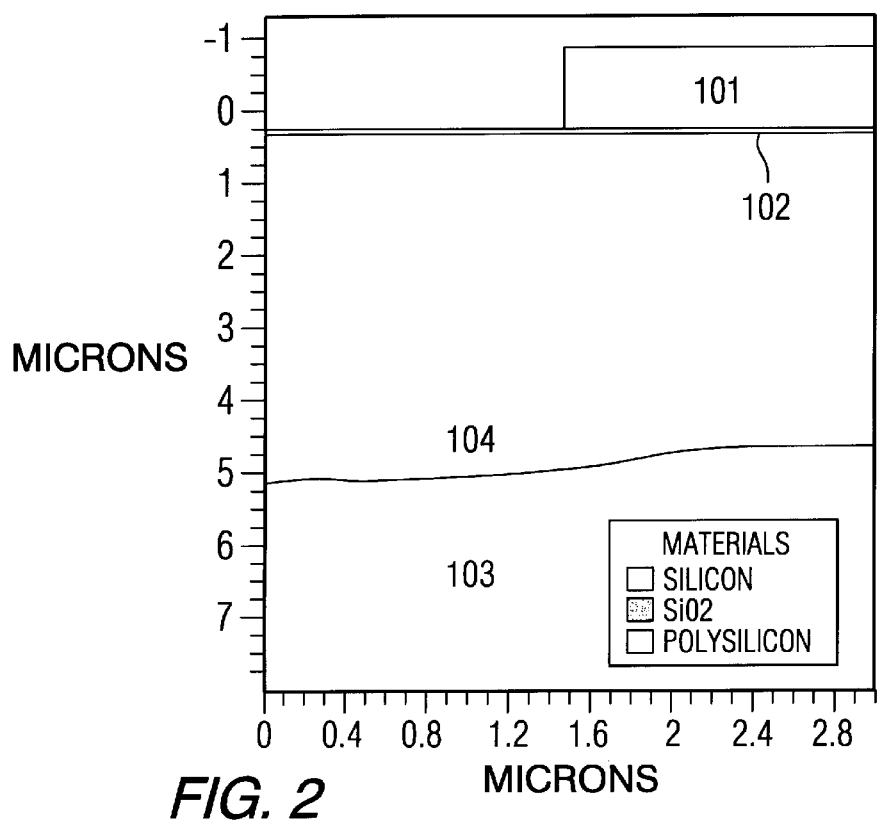

As shown in FIG. 1, a photoresist mask M is used to pattern a polysilicon layer 101 deposited over a thin gate oxide layer 102 that is grown over a silicon substrate 103. Mask M is removed, and an upper base region 104 is formed by implanting and driving a dopant of a second conductivity type into substrate 103, as shown in FIG. 2. If fabrication of a MOSFET is desired, formation of upper base region 104 is omitted.

Figure 3:
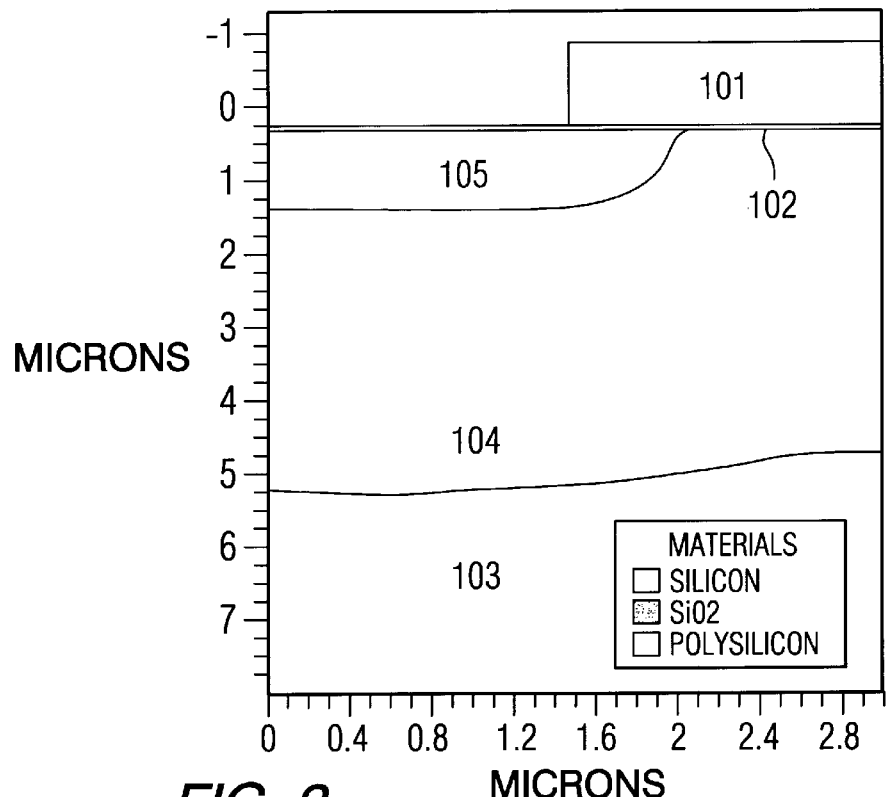
Figure 4:
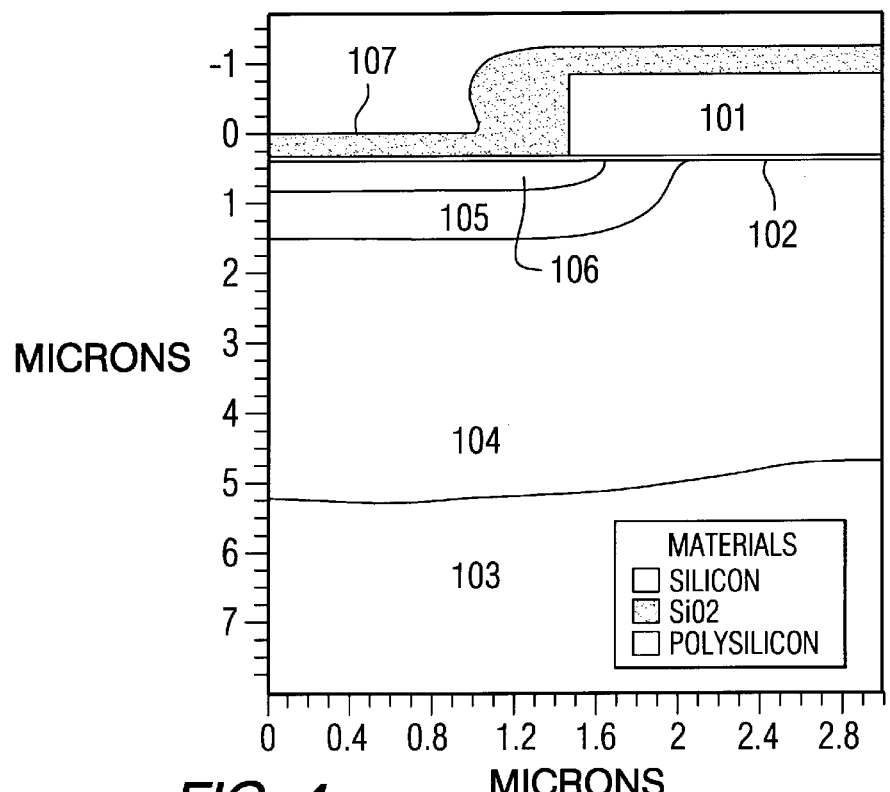
Figure 5:
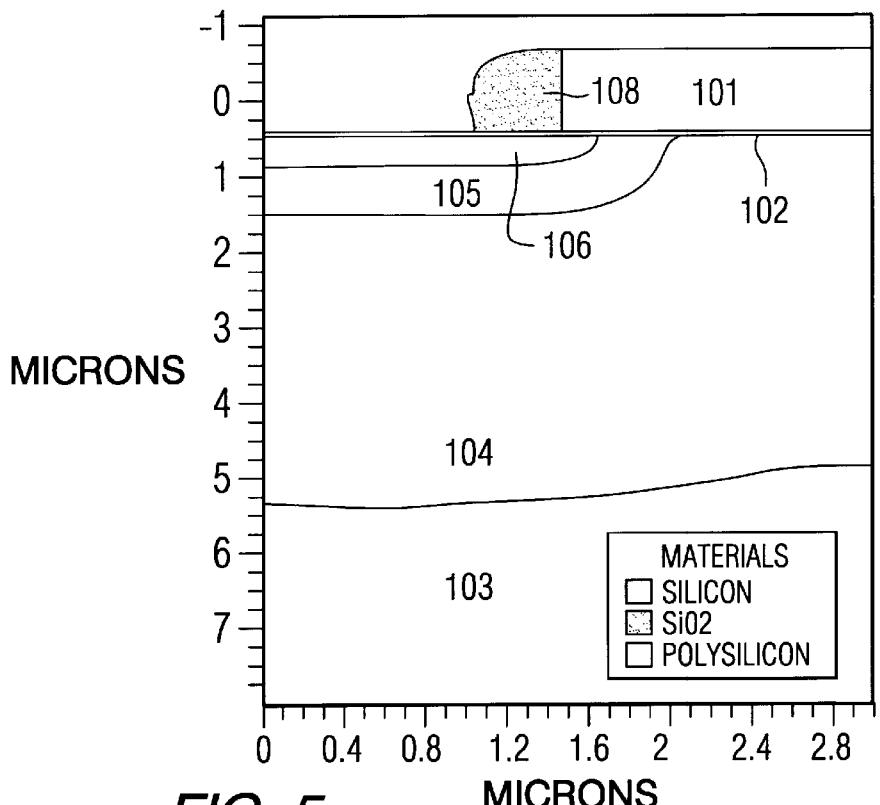

FIG. 3 depicts formation of a well region 105 by implanting and driving a dopant of a first conductivity type into upper base region 104. Next, a shallow source region 106 is formed by implanting and driving a dopant of the second conductivity type into well region 105, and a layer of oxide 107 is deposited over the entire structure, as shown in FIG. 4. Oxide layer 107 is etched to form spacer 108 adjacent polysilicon layer 101, as shown in FIG. 5.

Figure 6:
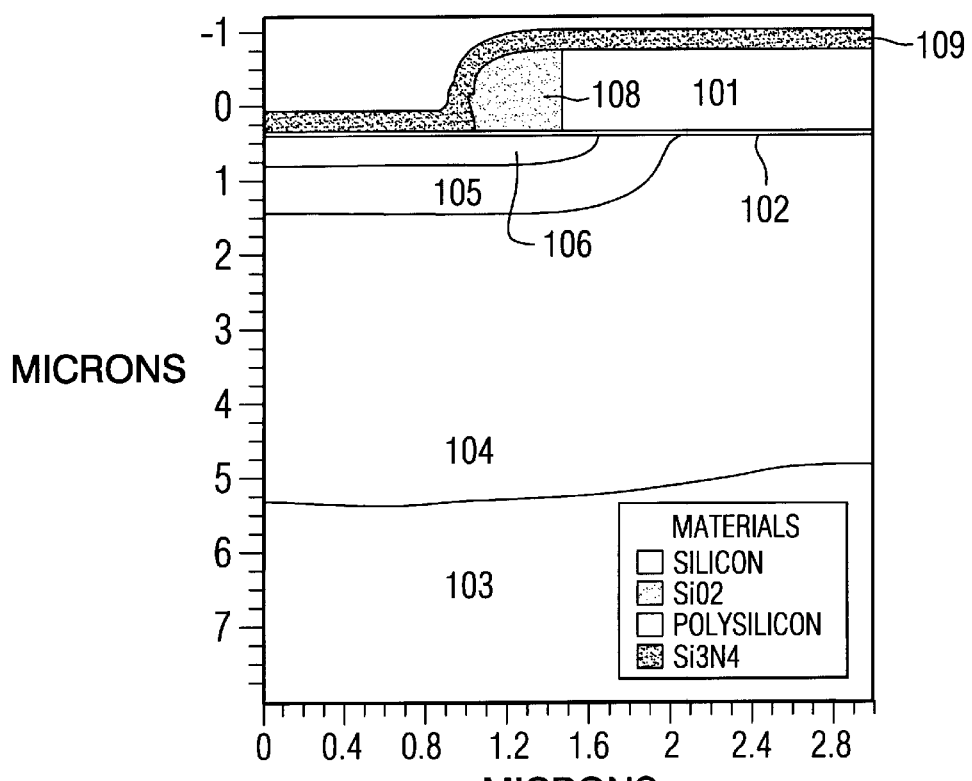
Figure 7:
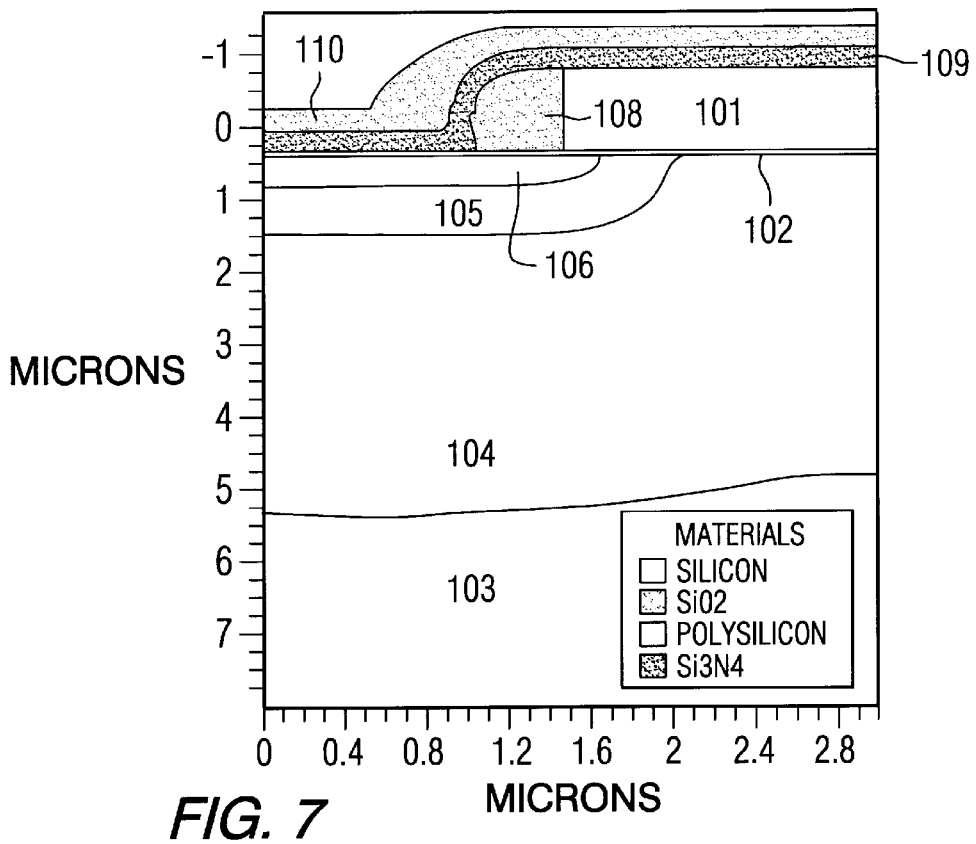
Figure 8:
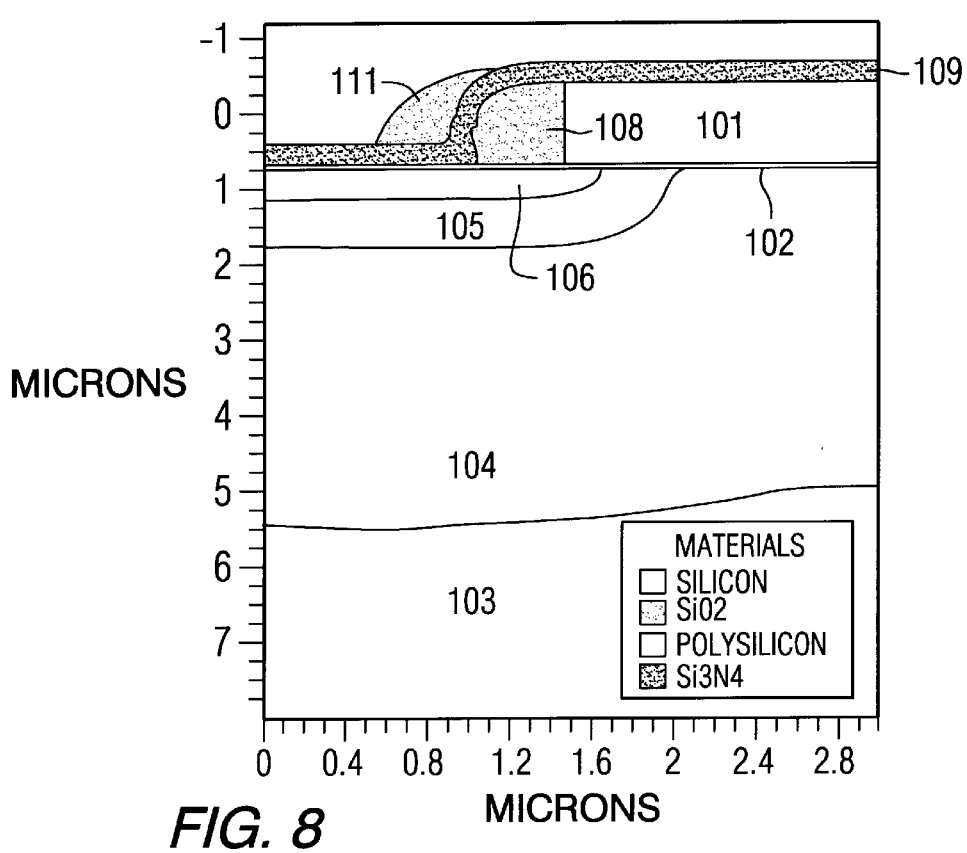

As depicted in FIG. 6, a thin silicon nitride layer 109 is deposited over the structure. Layer 109 protects spacer 108 against further etching. A second layer of oxide 110 is deposited on nitride layer 109, as shown in FIG. 7; oxide layer is then etched to form second spacer 111, as shown in FIG. 8.

Figure 9:
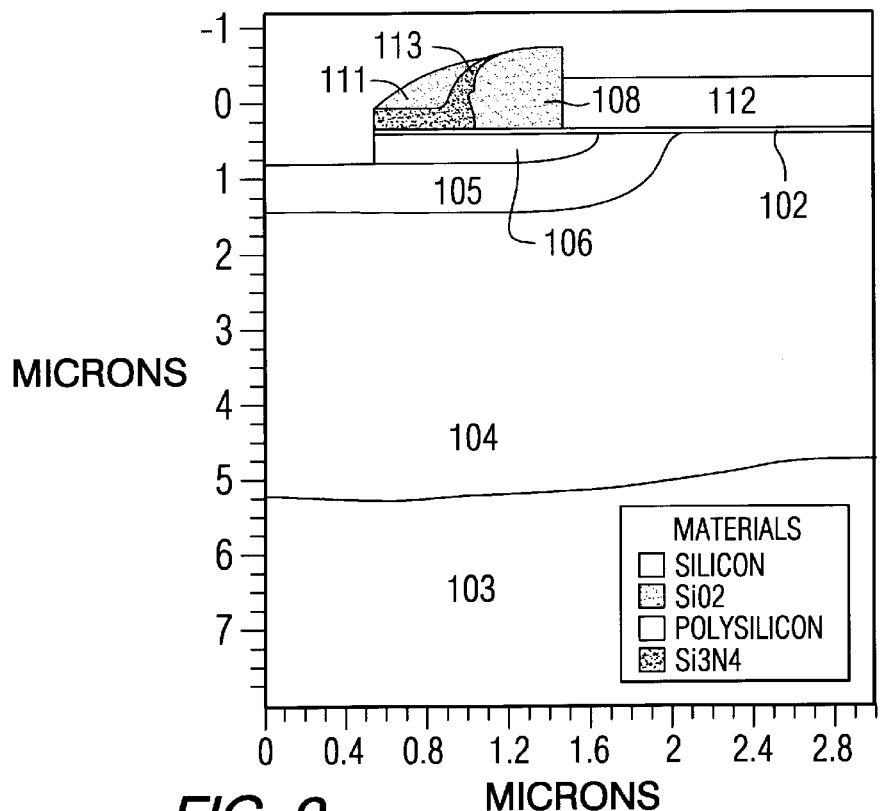
Figure 10:
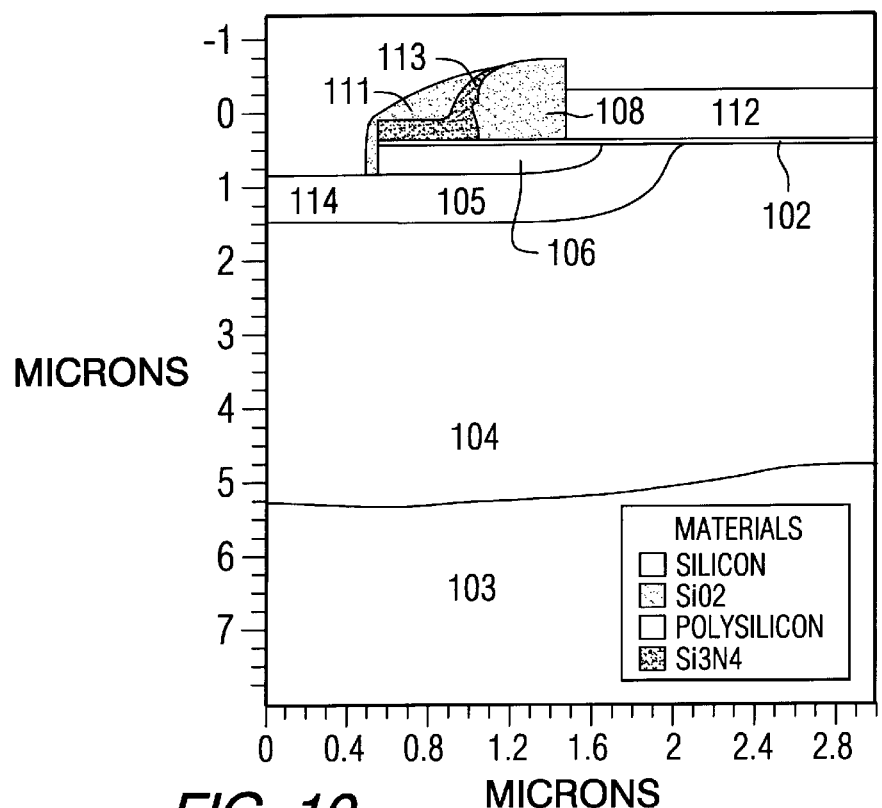

As depicted in FIG. 9, plasma etching removes a portion of polysilicon layer 101, leaving gate polysilicon 112, as well as most of nitride layer 109, leaving only thin nitride spacer 113 between spacers 108 and 111. An emitter region 114 is formed by implanting and driving to a shallow depth in well region 105 a dopant of the first conductivity type, as shown in FIG. 10.

Figure 11:
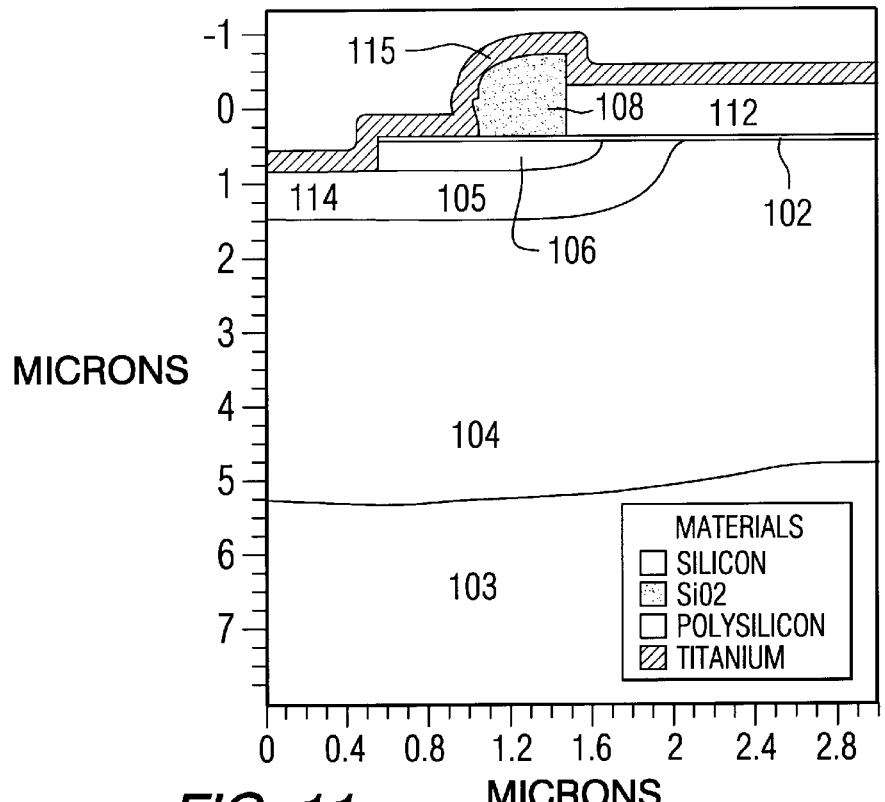

Following removal of oxide spacer 111 and thin nitride spacer 113 by selective etching, a layer of conductive material 115 is deposited over the structure, as depicted in FIG. 11. The conductive material of layer 115 can be formed from metals such as titanium, platinum, cobalt, and tungsten, the silicides of these metals, and mixtures of a metal and its corresponding silicide.

Figure 12:
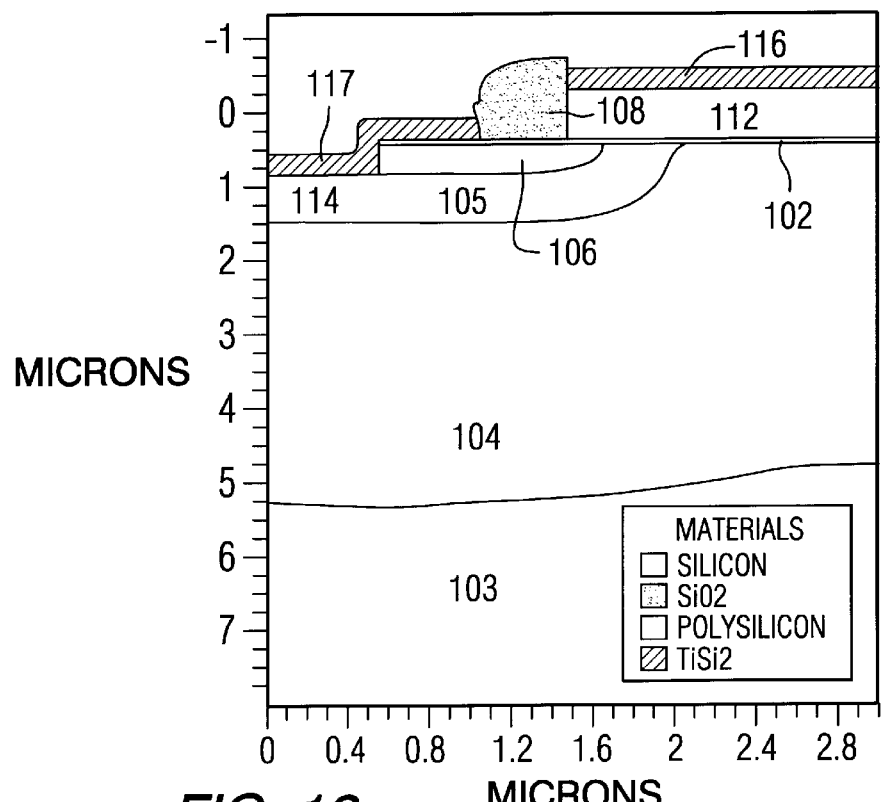
Figure 13:
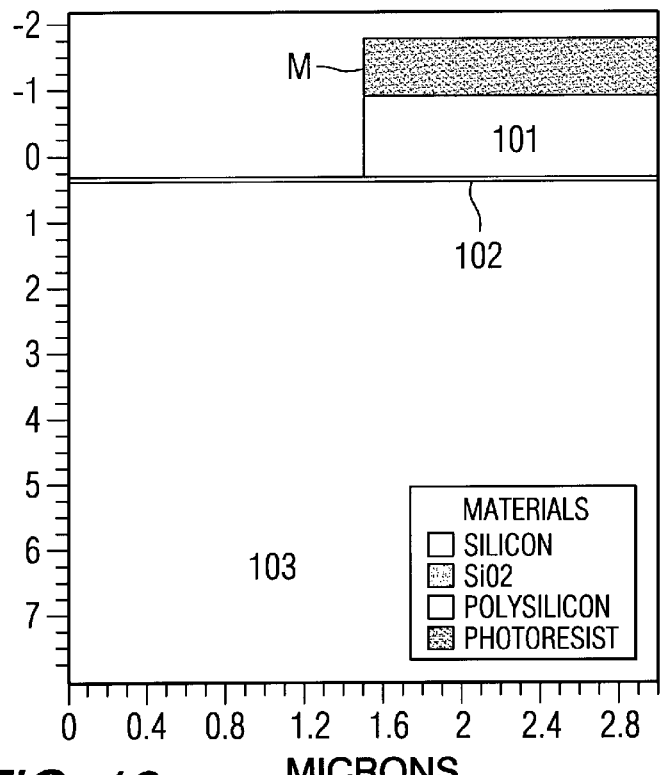
Figure 14:
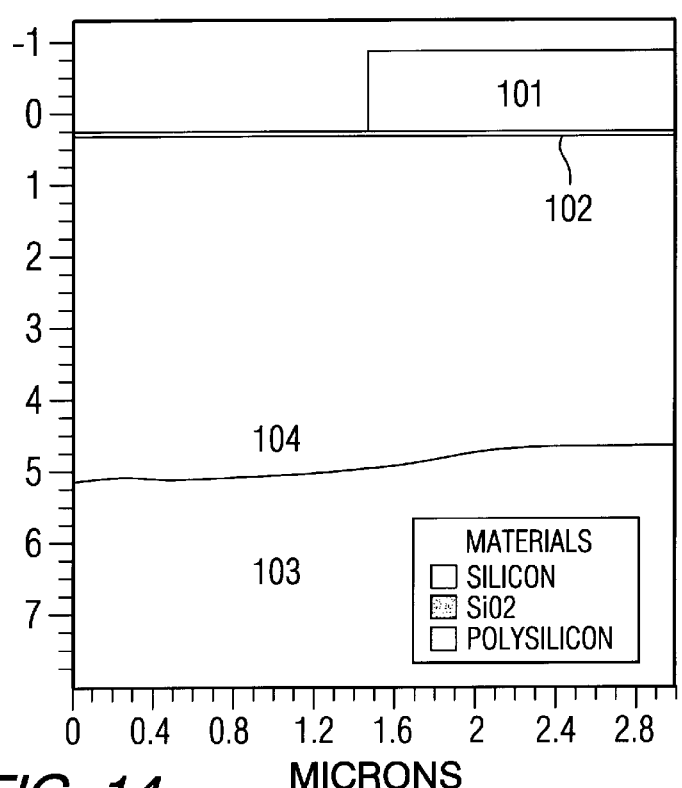
Figure 15:
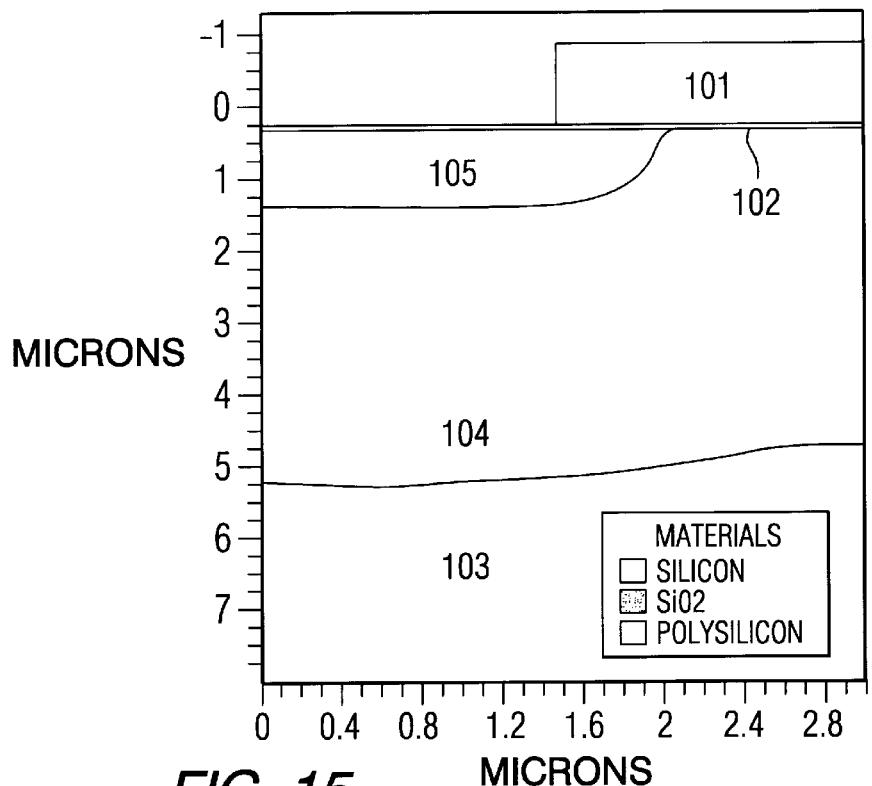
Figure 16:
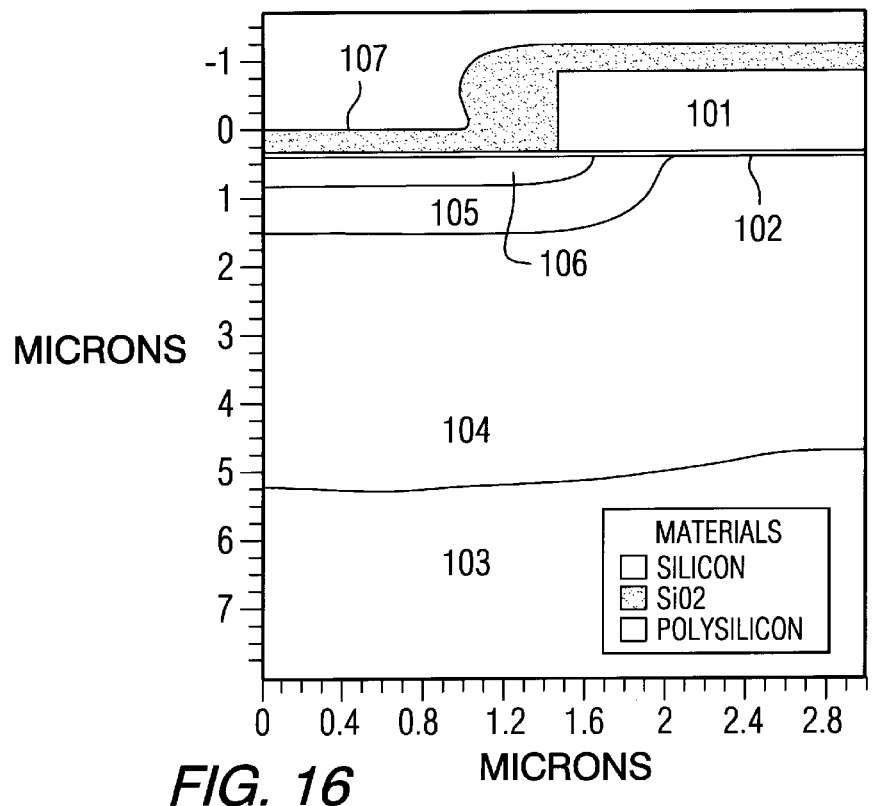
Figure 17:
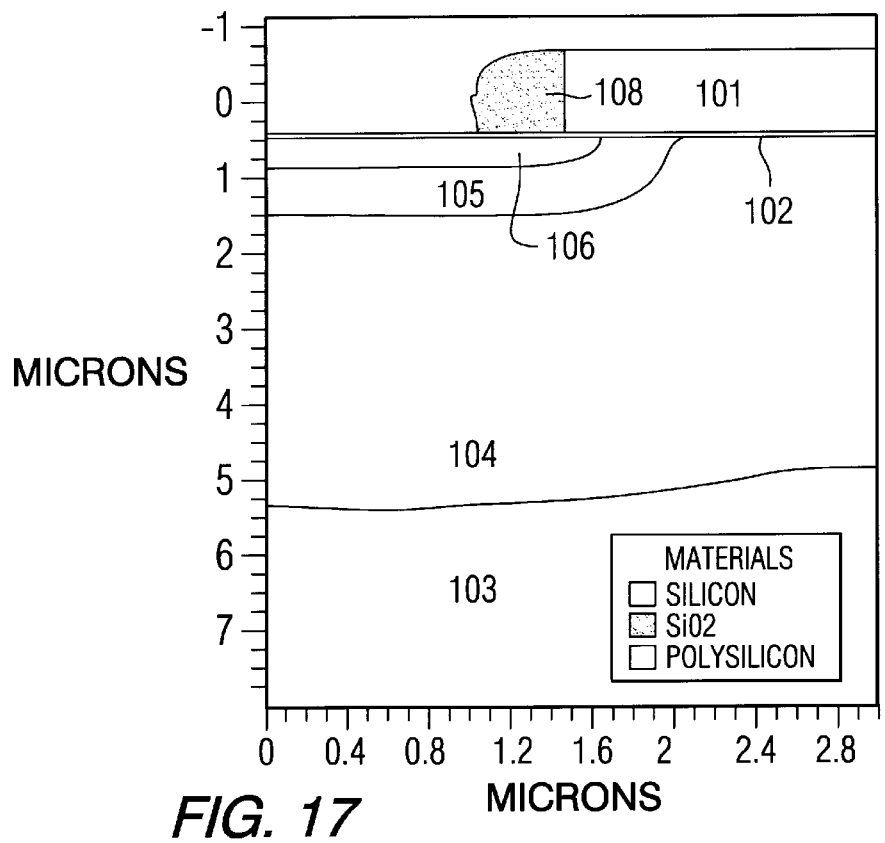

Layer 115, shown as comprising titanium, is salicided to gate polysilicon 112 and source/emitter region 106/114 to form, respectively, titanium silicide gate contact 116 and source contact 117, as shown in FIG. 12. Source contact 117 includes both a horizontal and vertical component, resulting in an enhancement of contact area that is beneficial for I-off capability.

In FIGS. 13–24 are depicted a second embodiment of the process of the present invention. The steps shown in FIGS. 13–17 are the same as the steps depicted in FIGS. 1–5 for the first embodiment.

Figure 18:
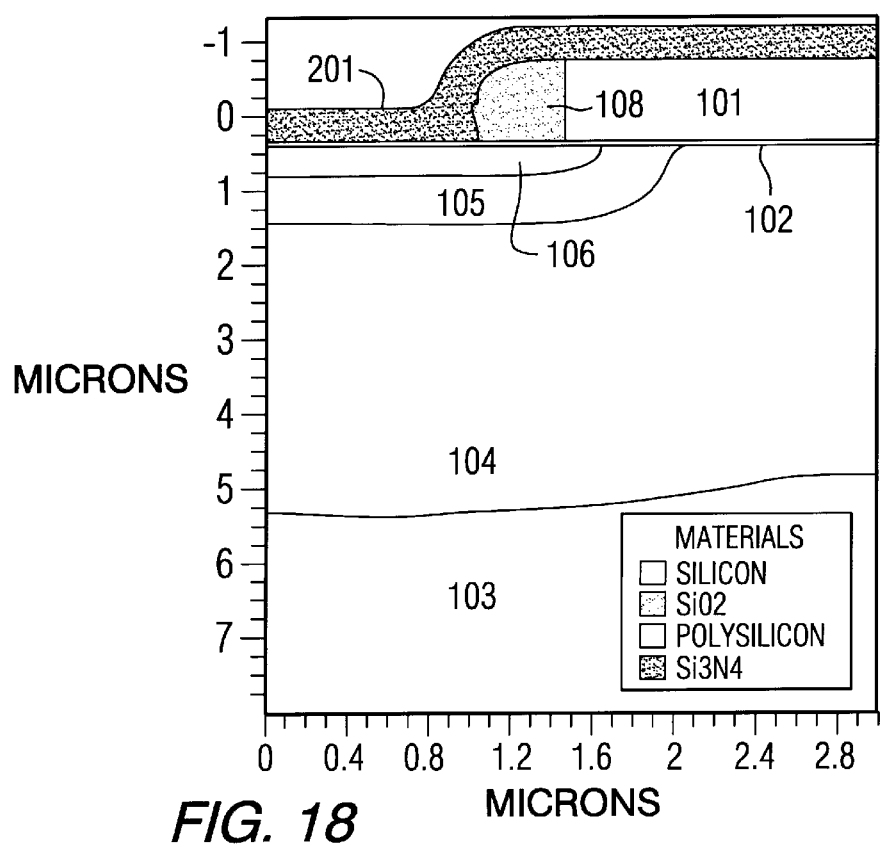
Figure 19:
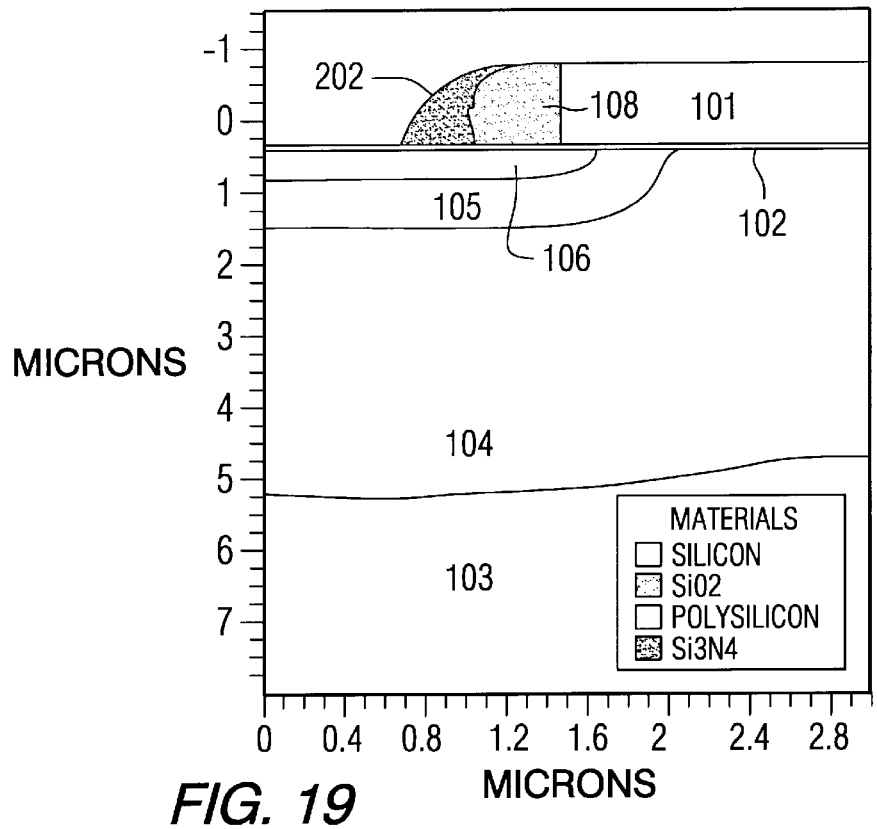
Figure 20:
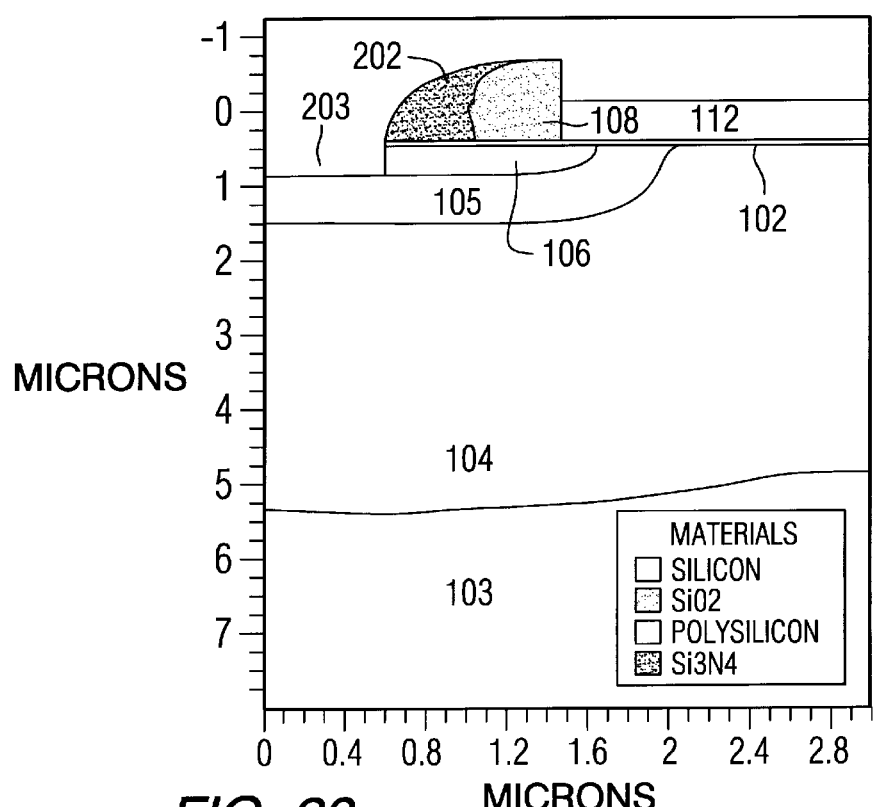
Figure 21:
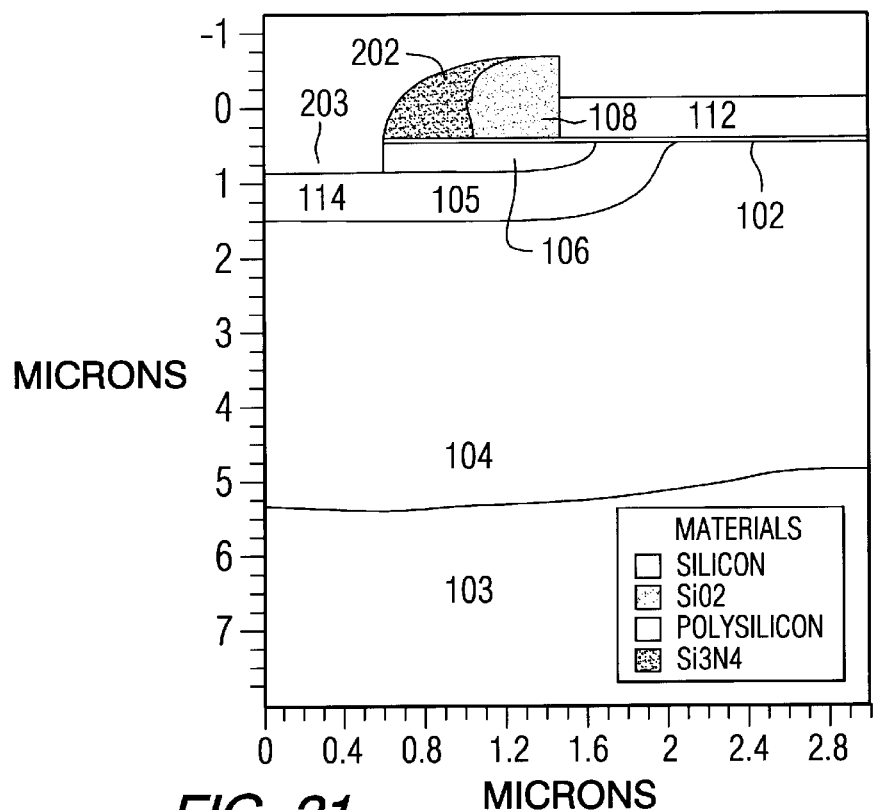

FIG. 18 shows the deposition over the structure of a nitride layer 201, which is etched to form a second spacer 202, as depicted in FIG. 19. Plasma etching removes a portion of polysilicon layer 101, leaving gate polysilicon 112, as well a portion of source region 106, forming a recess 203, as shown in FIG. 20. Then, as depicted in FIG. 21, a dopant of the first conductivity type is implanted into recess 203 and driven to a shallow depth to form an emitter region 114 in well region 105.

Figure 22:
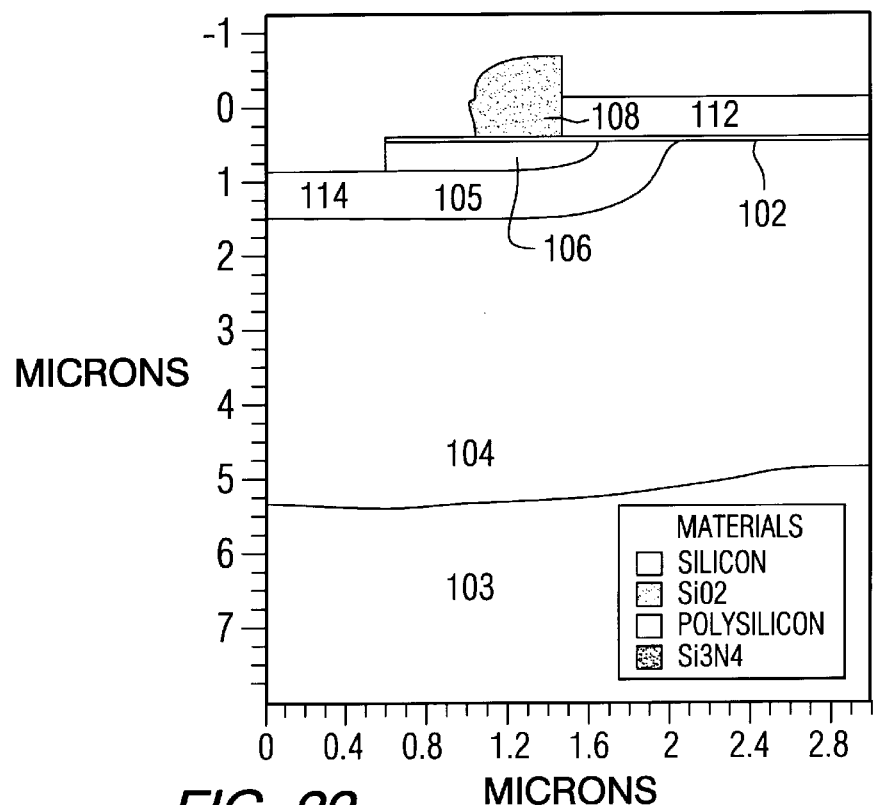
Figure 23:
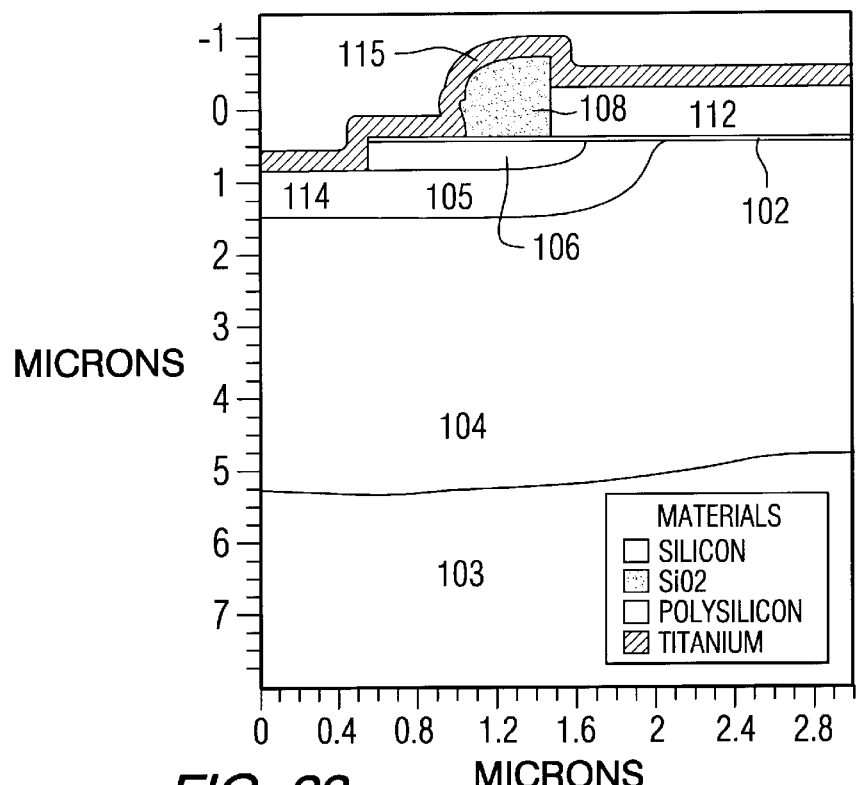
Figure 24:
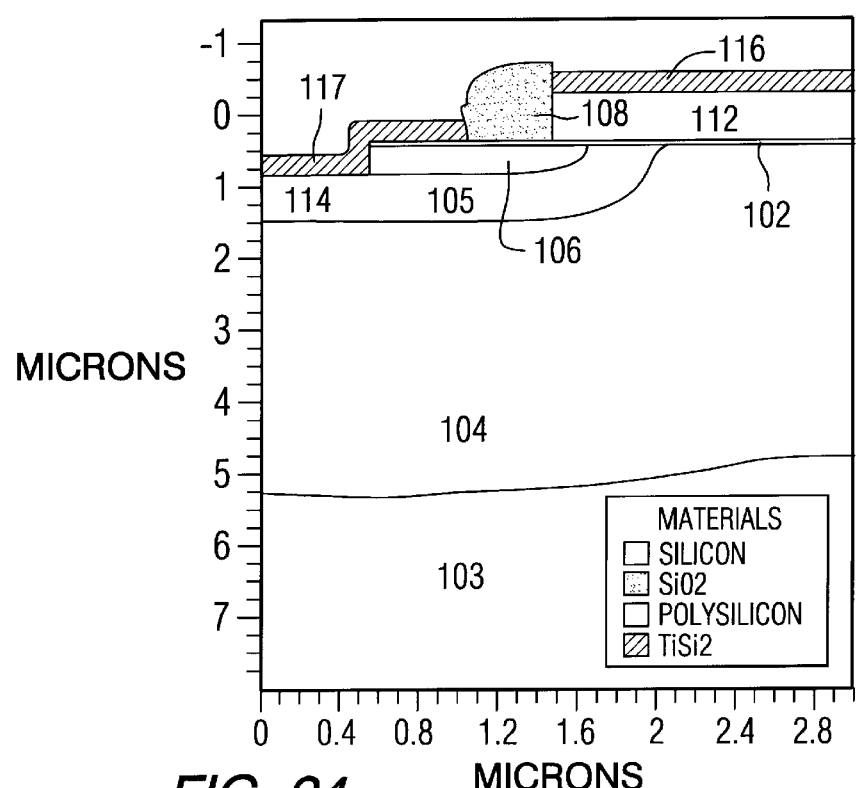

Second spacer 202 is removed by etching, as shown in FIG. 22 deposition of a layer of conductive material 115 and formation of gate contact 116 and source contact 117 are depicted in FIGS. 23 and 24, which are the same as the steps illustrated by FIGS. 11 and 12 for the first embodiment of the process of the present invention.

A vertical semiconductor device made by the process of the present invention is characterized by a desirable enhancement of the source contact area at peak species concentration. The increased contact area improves the continuity of the source contact salicide and thus increases turn-off capability.

The process of the present invention has substantial advantages over the above-discussed method of Davies, which employs a nitride spacer adjacent the gate. Because nitride has a much higher stress level than oxide, it is particularly prone to the formation of trap sites. The high interface state of nitride to silicon can result in leakage of current from the gate and, consequently, serious degradation of device performance. Furthermore, both the deposition and removal by etching of nitride is slower than the corresponding procedures involving oxide, which results in increased time and expense of device fabrication, especially when compared with the embodiment of the present invention that utilizes only a thin nitride layer deposited between two oxide spacers. Thus, the process of the present invention enjoys substantial advantages over the method of Davies that are not recognized or suggested in the reference.

The invention has been described in detail for the purpose of illustration, but it is understood that such detail is solely for that purpose, and variations can be made therein by those skilled in the art without departing from the spirit and scope of the invention, which id defined by the following claims.

What is claimed:

1. A process for forming a vertical semiconductor device having increased source contact area, said process comprising the steps of:

(a) on a silicon substrate, forming a gate comprising a layer of polysilicon deposited on a layer of oxide;

(b) implanting and driving a dopant of a first conductivity type into said substrate, thereby forming a well region in said substrate;

(c) implanting and driving a dopant of a second conductivity type into said well region, thereby forming a shallow source region in said well region;

(d) depositing a first layer of oxide over said gate and over said source and well regions in said substrate;

(e) selectively etching said first layer of oxide, thereby forming a first spacer of oxide on said substrate adjacent said gate;

(f) depositing a thin layer of nitride over said gate and over said source region in said substrate;

(g) depositing a second layer of oxide over said thin layer of nitride;

(h) selectively etching said second layer of oxide, thereby forming a second spacer of oxide, said second oxide spacer being separated from said first oxide spacer and said substrate by said thin nitride layer;

(i) using said oxide and nitride spacers as a mask, selectively plasma etching said polysilicon layer in said gate and said source region in said substrate, thereby removing said thin nitride layer from said gate and said substrate, a portion of said polysilicon layer from said gate, and a portion of said source region, thereby forming a recessed portion comprising substantially vertical and horizontal surfaces in said source region;

(j) implanting and driving a dopant of a first conductivity type into said recessed portion of said source region, thereby forming a shallow emitter region in said well region underlying said recessed portion;

(k) selectively etching said second oxide spacer and thin nitride layer separating said second oxide spacer from said first oxide spacer, thereby removing said second oxide spacer and said thin nitride layer; and (l) forming a layer of conductive material on the remaining polysilicon layer and on said source region; whereby said recessed portion of said source region provides increased contact area with said conductive material.

2. The process of claim 1 further comprising the step of:

(a') following step of forming said gate, implanting and driving a dopant of a second conduction type into said substrate, thereby forming an upper base region in said substrate.

3. The process of claim 1 wherein said first conduction type is P and said second conduction type is N.

4. The process of claim 1 wherein said conductive material is selected from the group consisting of the metals titanium, platinum, cobalt, and tungsten, the corresponding suicides of said metals, and mixtures of said metals and said corresponding silicides.

5. The process of claim 4 wherein said conductive material is selected from the group consisting of titanium, titanium silicide, and mixtures thereof.

6. The process of claim 1 wherein said vertical semiconductor device is selected from the group consisting of a MOSFET, an MOS-controlled thyristor, and an insulated gate bipolar transistor.

7. A process for forming a vertical semiconductor device having increased source contact area, said process comprising the steps of:

(a) on a silicon substrate, forming a gate comprising a layer of polysilicon deposited on a layer of oxide;

(b) implanting and driving a dopant of a first conductivity type into said substrate, thereby forming a well region in said substrate;

(c) implanting and driving a dopant of a second conductivity type into said well region, thereby forming a shallow source region in said well region;

(d) depositing a layer of oxide over said gate and over said source and well regions in said substrate;

(e) selectively etching said layer of oxide, thereby forming a spacer of oxide on said substrate adjacent said gate;

(f) depositing a layer of nitride over said gate and over said source region in said substrate;

(g) selectively etching said layer of nitride, thereby forming a spacer of nitride adjacent said oxide spacer;

(h) using said oxide and nitride layers as a mask, selectively plasma etching said polysilicon layer in said gate and said source region in said substrate, thereby removing a portion of said polysilicon layer from said gate and a portion of said source region, thereby forming a recessed portion comprising substantially vertical and horizontal surfaces in said source region;

(i) implanting and driving a dopant of a first conductivity type into said recessed portion of said source region, thereby forming a shallow emitter region in said well region underlying said recessed portion;

(j) selectively etching said nitride spacer, thereby removing said second nitride spacer; and (k) forming a layer of conductive material on the remaining polysilicon layer and on said source region; whereby said recessed portion of said source region provides increased contact area with said conductive material.

8. The process of claim 7 further comprising the step of:

(a') following step of forming said gate, implanting and driving a dopant of a second conduction type into said substrate, thereby forming an upper base region in said substrate.

9. The process of claim 7 wherein said first conduction type is P and said second conduction type is N.

10. The process of claim 7 wherein said conductive material is selected from the group consisting of the metals titanium, platinum, cobalt, and tungsten, the corresponding silicides of said metals, and mixtures of said metals and said corresponding silicides.

11. The process of claim 10 wherein said conductive material is selected from the group consisting of titanium titanium silicide, and mixtures thereof.

12. The process of claim 7 wherein said vertical semiconductor device is selected from the group consisting of a MOSFET, an MOS-controlled thyristor, and an insulated gate bipolar transistor.

* * * * *

UNITED STATES PATENT AND TRADEMARK OFFICE
CERTIFICATE OF CORRECTION

PATENT NO.   : 6,214,673 B1
DATED        : April 10, 2001
INVENTOR(S)  : Thomas Eugene Grebs and Jason Richard Trost It is certified that error appears in the above-identified patent and that said Letters Patent is hereby corrected as shown below:

<u>Column 5,</u>
Line 28, delete the word "suicides" and replace it with the word -- silicides. --.

Signed and Sealed this

Fourth Day of March, 2003

JAMES E. ROGAN
*Director of the United States Patent and Trademark Office*